United States Patent
Yu (10) Patent No.: US 6,376,320 B1
(45) Date of Patent: Apr. 23, 2002

(54) METHOD FOR FORMING FIELD EFFECT TRANSISTOR WITH SILICIDES OF DIFFERENT THICKNESS AND OF DIFFERENT MATERIALS FOR THE SOURCE/DRAIN AND THE GATE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/712,995

(22) Filed: Nov. 15, 2000

(51) Int. Cl.$^7$ ............................................. H01L 21/336
(52) U.S. Cl. ...................... 438/303; 438/592; 438/307; 438/595; 438/652; 438/586
(58) Field of Search .................... 438/199, 299, 438/197, 303, 300, 301, 307, 305, 286, 585, 586, 592, 595, 682, 649, 652

(56) References Cited

U.S. PATENT DOCUMENTS 5,731,239 A * 3/1998 Wong et al. ................. 438/296
5,953,612 A * 9/1999 Lin et al. ..................... 438/299

\* cited by examiner

Primary Examiner—Olik Chaudhuri
Assistant Examiner—Jack Chen
(74) Attorney, Agent, or Firm—Monica H. Choi

(57) ABSTRACT

For fabricating a field effect transistor having a gate structure on a gate dielectric within an active device area of a semiconductor substrate, a hardmask dielectric material covers a top surface of the gate structure. A drain silicide is formed with a drain contact junction that is exposed, and a source silicide is formed with a source contact junction that is exposed. The drain silicide and the source silicide have a first thickness and are comprised of a first silicide material. The hardmask dielectric material that covers the top surface of the gate structure prevents formation of silicide with the gate structure during formation of the drain silicide and the source silicide. An encapsulating dielectric material is then deposited to cover the drain silicide and the source silicide using a low temperature of less than about 400° Celsius. The hardmask dielectric material is etched away from the top surface of the gate structure to expose the top surface of the gate structure. A gate silicide is formed with the gate structure, and the gate silicide has a second thickness and is comprised of a second silicide material. The encapsulating dielectric material covering the drain silicide and the source silicide prevents further formation of the drain silicide and the source silicide during formation of the gate silicide. The present invention may be used to particular advantage when the first thickness of the drain and source suicides is less than the second thickness of the gate silicide and when the first silicide material of the drain and source silicides is different from the second silicide material of the gate silicide.

5 Claims, 5 Drawing Sheets

METHOD FOR FORMING FIELD EFFECT TRANSISTOR WITH SILICIDES OF DIFFERENT THICKNESS AND OF DIFFERENT MATERIALS FOR THE SOURCE/DRAIN AND THE GATE

TECHNICAL FIELD

The present invention relates generally to fabrication of field effect transistors having scaled-down dimensions, and more particularly, to fabrication of a field effect transistor with silicides of different thicknesses and of different materials for the drain/source and the gate of the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Figure 1:
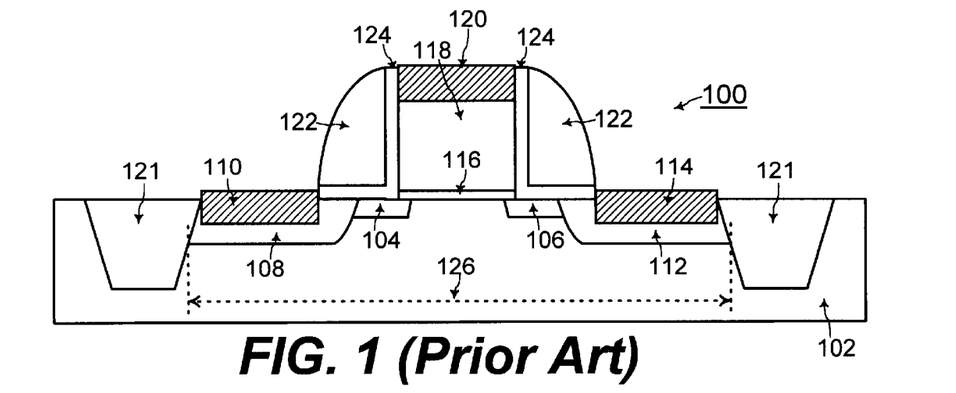
FIG. 1 shows a cross-sectional view of a MOSFET (Metal Oxide Semiconductor Field Effect Transistor) with the drain silicide, the source silicide, and the gate silicide formed simultaneously, according to the prior art.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are relatively shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

As the dimensions of the MOSFET 100 are scaled down further, such as 50 nm (nanometers) for the gate length of the MOSFET 100 for example, the depth of the drain extension junction 104 and the source extension junction 106 is also scaled down to about 15–30 nm (nanometers). The depth of the drain extension junction 104 and the source extension junction 106 is desired to be small to minimize short-channel effects in the MOSFET 100 as the gate length of the MOSFET 100 is scaled down, as known to one of ordinary skill in the art of integrated circuit fabrication.

In addition, the depth of the drain contact junction 108 and the source contact junction 112 is also scaled down proportionately. The drain silicide 110 should not reach down to the interface between the drain contact junction 108 and the semiconductor substrate 102, and the source silicide 112 should not reach down to the interface between the source contact junction 112 and the semiconductor substrate 102. Thus, as the depth of the drain contact junction 108 and the source contact junction 112 is scaled down, the thickness of the drain silicide 110 and the source silicide 114 is limited by the decreased depth of the drain contact junction 108 and the source contact junction 112.

In the prior art, the drain silicide 110, the source silicide 114, and the gate silicide 120 are typically formed simultaneously, as known to one of ordinary skill in the art of integrated circuit fabrication. Thus, in the prior art, the thickness of the drain silicide 110 and the source silicide 114 is substantially same as the thickness of the gate silicide 120, and the silicide material comprising the drain silicide 110 and the source silicide 114 is substantially same as the silicide material comprising the gate silicide 120. As the depth of the drain contact junction 108 and the source contact junction 112 is scaled down, the thickness of the drain silicide 110, the source silicide 114, and the gate silicide is limited by the decreased depth of the drain contact junction 108 and the source contact junction 112 when the drain silicide 110, the source silicide 114, and the gate silicide 120 are formed simultaneously in the prior art.

In addition, U.S. Pat. No. 5,731,239 to Wong et al. teaches forming a gate silicide that may be comprised of a different silicide material from that of the drain and source silicides, but does not teach forming a gate silicide having a larger thickness than that of the drain and source silicides. U.S. Pat. No. 5,953,612 to Lin et al. teaches forming a gate silicide having larger thickness than that of the drain and source silicides, but does not teach forming a gate silicide comprised of a different silicide material from that of the drain and source silicides. In addition, such prior art does not address minimizing short channel effects in the MOSFET having scaled down dimensions.

Although the thickness of the drain silicide 110 and the source silicide 114 may be limited by the decreased depth of the drain contact junction 108 and the source contact junction 112, a gate silicide with further minimized resistance is desired for minimizing parasitic resistance at the gate of the MOSFET. In addition, for the MOSFET having scaled down dimensions of tens of nanometers, disadvantageous short channel effects may degrade the performance of the MOSFET, as known to one of ordinary skill in the art of integrated circuit fabrication. Thus, short channel effects are desired to be minimized.

Thus, a mechanism is desired for fabricating the drain silicide 110 and the source silicide 114 to have a different thickness from the gate silicide 120 and to be comprised of a different silicide material from that of the gate silicide 120 to minimize resistance at the gate of the MOSFET.

SUMMARY OF THE INVENTION

Accordingly, in a general aspect of the present invention, the drain silicide and the source silicide are formed separately from formation of the gate silicide. The gate structure is covered with a hardmask dielectric material that prevents formation of a gate silicide with the gate structure during a first silicidation process for formation of the drain silicide and the source silicide. An encapsulating dielectric material covers the drain silicide and the source silicide to prevent further formation of the drain silicide and the source silicide during a second silicidation process for formation of the gate silicide with the gate structure.

In one embodiment of the present invention, in a method for fabricating a field effect transistor having a gate structure on a gate dielectric within an active device area of a semiconductor substrate, a drain extension junction and a source extension junction are formed in the active device area of the semiconductor substrate. Spacers are formed to cover the drain extension junction and the source extension junction and to cover sidewalls of the gate structure. A drain contact junction is formed adjacent the drain extension junction, and a source contact junction is formed adjacent the source extension junction by implanting a contact junction dopant into exposed regions of the active device area of the semiconductor substrate. A hardmask dielectric material is formed to cover a top surface of the gate structure. A drain silicide is formed with the drain contact junction that is exposed, and a source silicide is formed with the source contact junction that is exposed. The drain silicide and the source silicide have a first thickness and are comprised of a first silicide material. The hardmask dielectric material that covers the top surface of the gate structure prevents formation of silicide with the gate structure during formation of the drain silicide and the source silicide.

An encapsulating dielectric material is deposited, in a deposition process using a relatively low temperature of less than about 400° Celsius, to cover the drain silicide and the source silicide. The hardmask dielectric material is etched away from the top surface of the gate structure to expose the top surface of the gate structure. A gate silicide is formed with the gate structure, and the gate silicide has a second thickness and is comprised of a second silicide material. The encapsulating dielectric material covering the drain silicide and the source silicide prevents further formation of the drain silicide and the source silicide during formation of the gate silicide.

The first thickness of the drain and source silicides is less than the second thickness of the gate silicide, and the first silicide material of the drain and source suicides is different from the second silicide material of the gate silicide. In this manner, the thickness of the gate silicide is independent of the thickness of the drain and source suicides and is not limited by the decreased depth of the drain and source contact junctions as the dimensions of the MOSFET are further scaled down. A thicker gate silicide and a different gate silicide material decrease parasitic resistance at the gate of the MOSFET for enhanced speed performance of the MOSFET. In addition, because the encapsulating dielectric material is deposited in a deposition process using a relatively low temperature of less than about 400° Celsius, short channel effects are minimized for the MOSFET having scaled down dimensions of tens of nanometers.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 2:
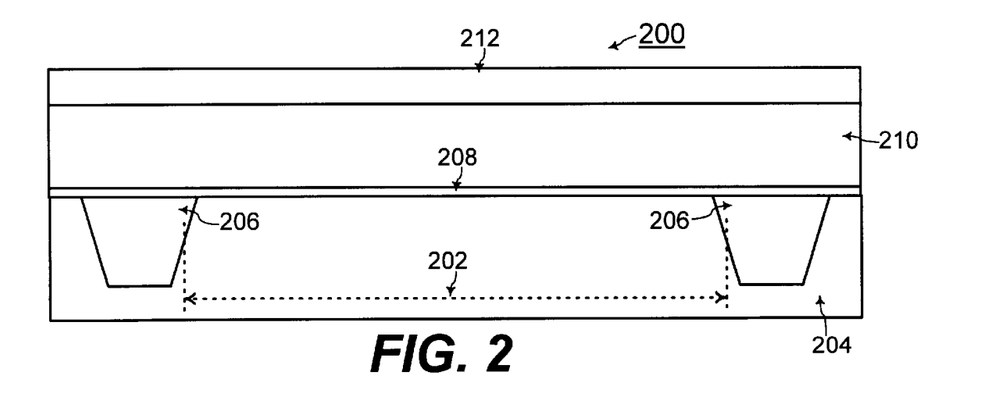
FIGS. 2, 3, 4, 5, 6, 7, 8, 9, 10, 11, 12, and 13 show cross-sectional views for illustrating the steps for forming a drain silicide and a source silicide separately from forming the gate silicide such that the gate silicide may have a different thickness from that of the drain and source suicides and such that the gate silicide may be comprised of a different silicide material from that of the drain and source silicides, according to an embodiment of the present invention.

In the cross-sectional view of FIG. 2, an active device area 202 is formed in a semiconductor substrate 204 by STI (shallow trench isolation) structures 206. The semiconductor substrate 204 may be comprised of silicon in one embodiment of the present invention. STI (shallow trench isolation) technology for electrical isolation of an active device area is known to one of ordinary skill in the art of integrated circuit fabrication.

A layer of gate dielectric material 208 and a layer of gate structure material 210 are deposited on the active device area 202 of the semiconductor substrate. The layer of gate dielectric material 208 may be comprised of silicon dioxide ($SiO_2$) or a dielectric material with a dielectric constant that is lower than that of silicon dioxide ($SiO_2$), as known to one of ordinary skill in the art of integrated circuit fabrication. The layer of gate structure material 210 may be comprised of a semiconductor material such as polysilicon, in one embodiment of the present invention.

In addition, a layer of BARC (Bottom Anti-Reflective Coating) material 212 is deposited on the layer of gate structure material 210. The layer of BARC material 212 is comprised of a hardmask dielectric material such as silicon nitride (SiN) or silicon oxynitride (SiON) with a thickness in a range of from about 150 Å (angstroms) to about 200 Å (angstroms) in one embodiment of the present invention. Processes for deposition of such materials for the layer of gate dielectric material 208, the layer of gate structure material 210, and the layer of BARC material 212 are known to one of ordinary skill in the art of integrated circuit fabrication.

Figure 3:
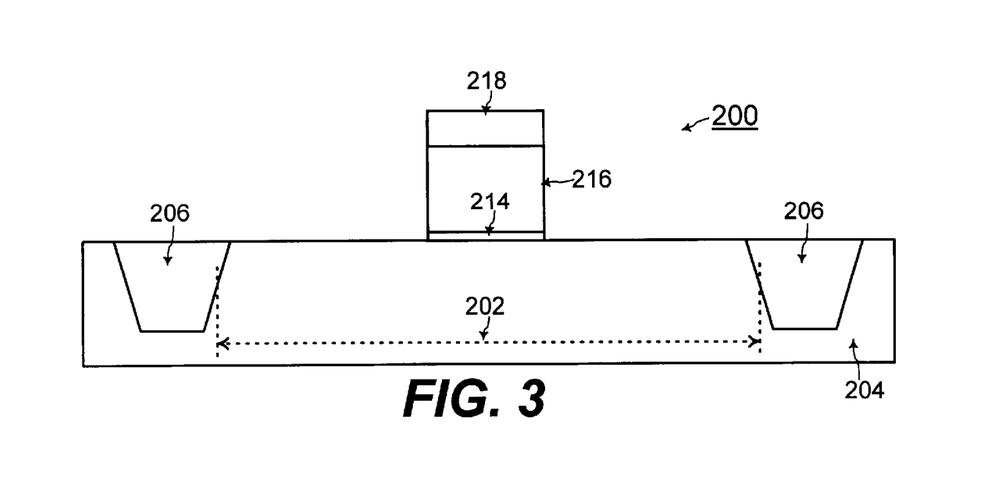

Referring to FIG. 3, for formation of a MOSFET 200 according to an aspect of the present invention, the layer of gate dielectric material 208, the layer of gate structure material 210, and the layer of BARC material 212 are patterned and etched to form a gate dielectric 214 and a gate structure 216 of the MOSFET 200. The gate dielectric 214 is formed from patterning and etching of the layer of gate dielectric material 208, and the gate structure 216 is formed from patterning and etching of the layer of gate structure material 210. A portion 218 of the BARC material 212 remains to cover the top surface of the gate structure 216.

Photolithography processes for patterning and etching the layer of gate dielectric material 208, the layer of gate structure material 210, and the layer of BARC material 212 are known to one of ordinary skill in the art of integrated circuit fabrication. The layer of BARC material 212 improves resolution during the patterning and etching of the layer of gate dielectric material 208, the layer of gate structure material 210, and the layer of BARC material 212, as known to one of ordinary skill in the art of integrated circuit fabrication.

Figure 4:
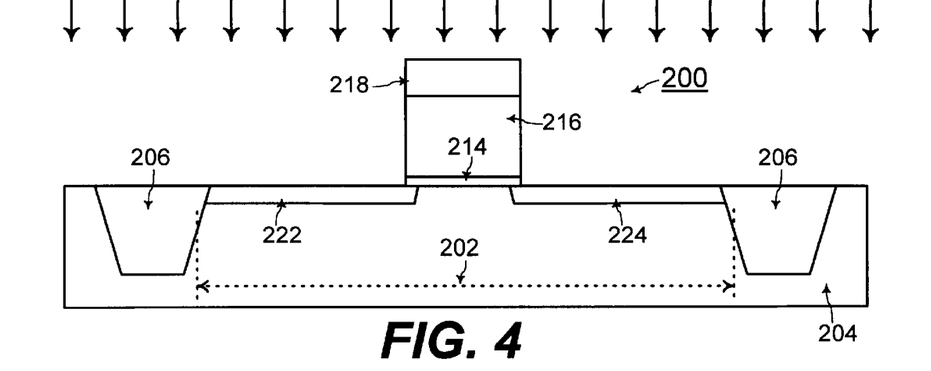

Referring to FIG. 4, an extension junction dopant is implanted into exposed regions of the active device area 202 of the semiconductor substrate 204 to form a drain extension junction 222 and a source extension junction 224. The drain extension junction 222 and the source extension junction 224 are relatively shallow junctions to minimize short-channel effects in the MOSFET 200 having submicron or nanometer dimensions, as known to one of ordinary skill in the art of integrated circuit fabrication.

The extension junction dopant is an N-type dopant for forming the drain extension junction 222 and the source extension junction 224 of an NMOSFET (N-channel Metal Oxide Semiconductor Field Effect Transistor). Alternatively, the extension junction dopant is a P-type dopant for forming the drain extension junction 222 and the source extension junction 224 of a PMOSFET (P-channel Metal Oxide Semiconductor Field Effect Transistor). Processes for implanting the extension junction dopant for formation of the drain extension junction 222 and the source extension junction 224 are known to one of ordinary skill in the art of integrated circuit fabrication.

Figure 5:
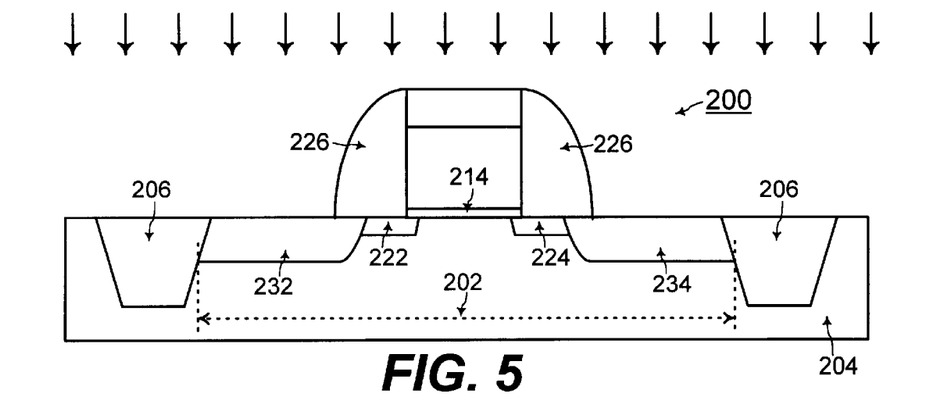

Referring to FIG. 5, spacers 226 are formed to cover the sidewalls of the gate structure 216 and to cover a portion of the drain extension junction 222 and a portion of the source extension junction 224 within the active device area 202 of the semiconductor substrate 204. The spacers 226 may be comprised of silicon dioxide ($SiO_2$) and are typically formed by deposition of such material and anisotropic etching, as known to one of ordinary skill in the art of integrated circuit fabrication.

Further referring to FIG. 5, a contact junction dopant is implanted into exposed regions of the active device area 202 of the semiconductor substrate 204 to form a drain contact junction 232 and a source contact junction 234. The drain contact junction 232 and the source contact junction 234 are deeper junctions than the drain and source extension junctions 222 and 224 for formation of silicide therein, as known to one of ordinary skill in the art of integrated circuit fabrication.

The contact junction dopant is an N-type dopant for forming the drain contact junction 232 and the source contact junction 234 of an NMOSFET (N-channel Metal Oxide Semiconductor Field Effect Transistor). Alternatively, the contact junction dopant is a P-type dopant for forming the drain contact junction 232 and the source contact junction 234 of a PMOSFET (P-channel Metal Oxide Semiconductor Field Effect Transistor). Processes for implanting the contact junction dopant for formation of the drain contact junction 232 and the source contact junction 234 are known to one of ordinary skill in the art of integrated circuit fabrication.

A thermal anneal process may be performed to activate the extension junction dopant within the drain and source extension junctions 222 and 224 and to active the contact junction dopant within the drain and source contact junctions 232 and 234. Thermal anneal processes for activating dopant are known to one of ordinary skill in the art of integrated circuit fabrication.

Figure 6:
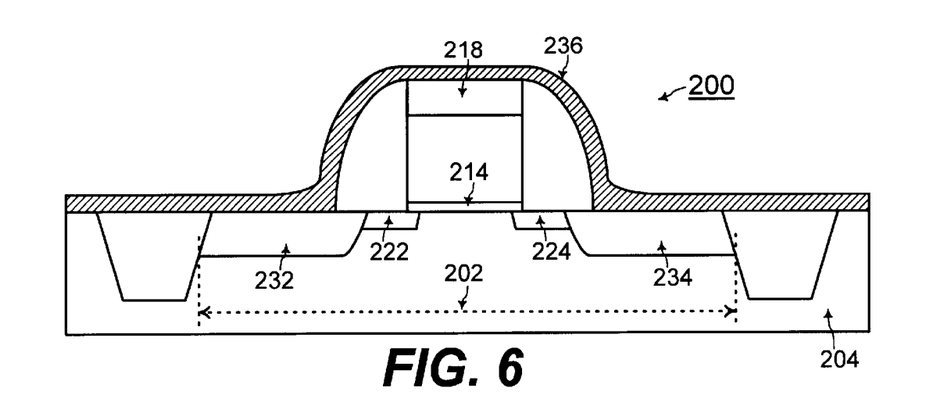

Referring to FIG. 6, a first layer of metal 236 is conformally deposited to contact the drain contact junction 232 and the source contact junction 234. The hardmask dielectric material 218 covers the top surface of the gate structure 216 and prevents the first layer of metal 236 from contacting the gate structure 216. The first layer of metal 236 may be comprised of one of titanium, cobalt, nickel, or platinum, and processes for conformally depositing such metal are known to one of ordinary skill in the art of integrated circuit fabrication.

Figure 7:
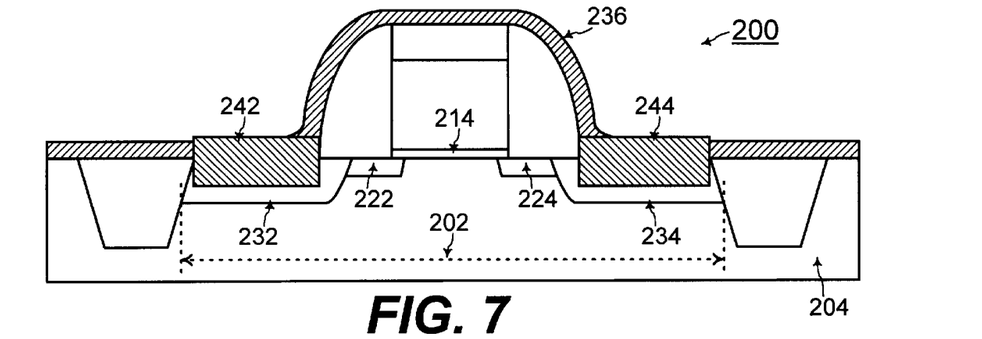

Referring to FIG. 7, a first silicidation process is performed to form a drain silicide 242 from a reaction of the first layer of metal 236 with the silicon of the drain contact junction 232 and to form a source silicide 244 from a reaction of the first layer of metal 236 with the silicon of the source contact junction 234. The drain and source silicides 242 and 244 are comprised of a first metal silicide material that depends on the metal of the first layer of metal 236. When the first layer of metal 236 is comprised of titanium, the drain and source silicides 242 and 244 are comprised of titanium silicide ($TiSi_2$). When the first layer of metal 236 is comprised of cobalt, the drain and source silicides 242 and 244 are comprised of cobalt silicide ($CoSi_2$). When the first layer of metal 236 is comprised of nickel, the drain and source silicides 242 and 244 are comprised of nickel silicide ($NiSi_2$). When the first layer of metal 236 is comprised of platinum, the drain and source silicides 242 and 244 are comprised of platinum silicide ($PtSi_2$).

During the first silicidation process for forming the drain and source suicides 242 and 244, the hardmask dielectric material 218 covers the top surface of the gate structure 216 and prevents the first layer of metal 236 from contacting the gate structure 216. Thus, silicide is not formed from a reaction of the first layer of metal 236 with the gate structure 216 during the first silicidation process for forming the drain and source silicides 242 and 244.

Silicidation processes for formation of the drain and source suicides 242 and 244 such as by heating up the semiconductor substrate 204 are known to one of ordinary skill in the art of integrated circuit fabrication. The thickness of the drain and source silicides 242 and 244 depends on the thickness of the first layer of metal 236 and on the duration of heating up the semiconductor substrate 204 during the silicidation process. Such parameters are controlled such that the drain and source silicides 242 and 244 have a first thickness.

The drain silicide 242 should not reach down to the interface between the drain contact junction 232 and the semiconductor substrate 204, and the source silicide 244 should not reach down to the interface between the source contact junction 234 and the semiconductor substrate 204. Thus, as the dimensions of the MOSFET 200 are scaled down such that the depth of the drain and source contact junctions 232 and 234 are scaled down, the first thickness of the drain and source silicides 242 and 244 is limited by the depth of the drain and source contact junctions 232 and 234.

Figure 8:
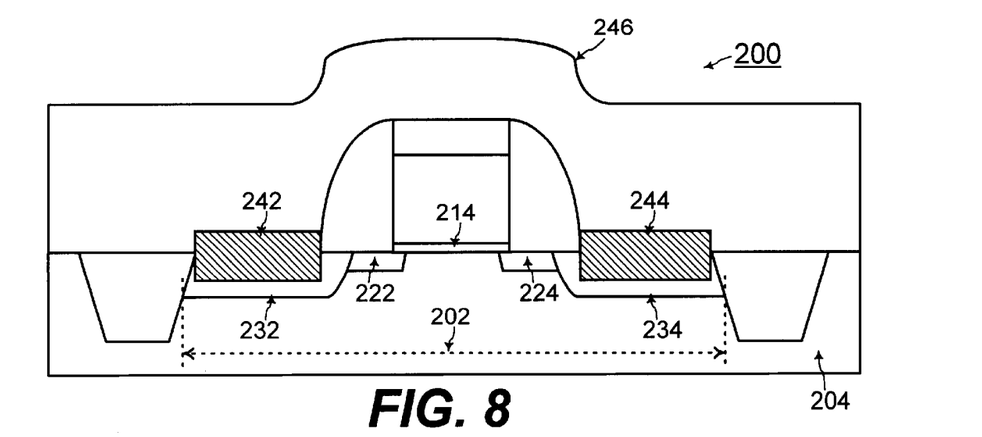

Referring to FIG. 8, any remaining portion of the first layer of metal 236 is removed after formation of the drain and source silicides 242 and 244. Processes for etching away the metal comprising the first layer of metal 236 are known to one of ordinary skill in the art of integrated circuit fabrication.

Further referring to FIG. 8, a layer of encapsulating dielectric material 246 is conformally deposited to cover the drain and source silicides 242 and 244. The layer of encapsulating dielectric material 246 may be comprised of silicon dioxide ($SiO_2$) with a thickness in a range of from about 3000 Å (angstroms) to about 5000Å (angstroms) according to one embodiment of the present invention. The layer of encapsulating dielectric material 246 is preferably deposited using a relatively low temperature (less than about 400°

Celsius) to minimize thermal diffusion of the dopants within the drain and source extension junctions 222 and 224 and within the drain and source contact junctions 232 and 234. Such low temperature deposition processes for conformally depositing the layer of encapsulating dielectric material 246 are known to one of ordinary skill in the art of integrated circuit fabrication.

Figure 9:
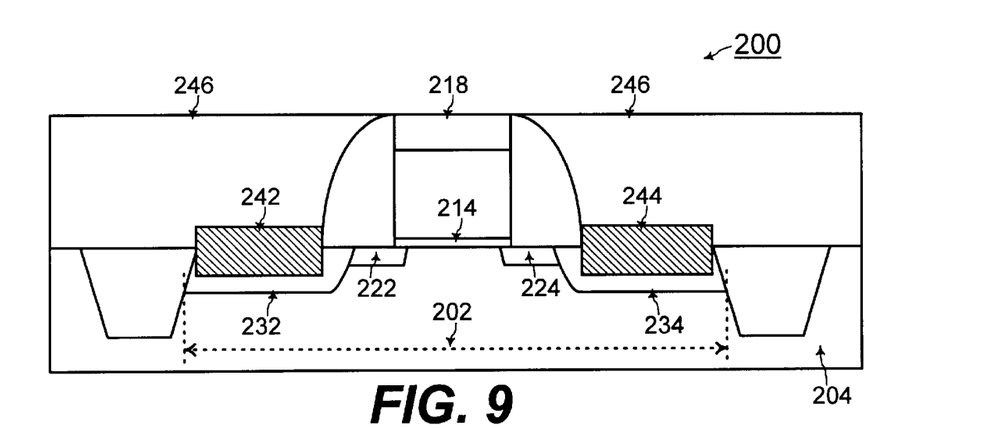

Additionally referring to FIG. 8, the layer of encapsulating dielectric material 246 is covering the hardmask dielectric material 218. Referring to FIG. 9, the layer of encapsulating dielectric material 246 is polished down until the hardmask dielectric material 218 on the top surface of the gate structure 216 is exposed. The hardmask dielectric material 218 may be a polish-stop during polishing of the layer of encapsulating dielectric material 246. Processes such as CMP (chemical-mechanical polishing) processes for polishing the layer of encapsulating dielectric material 246 are known to one of ordinary skill in the art of integrated circuit fabrication.

Figure 10:
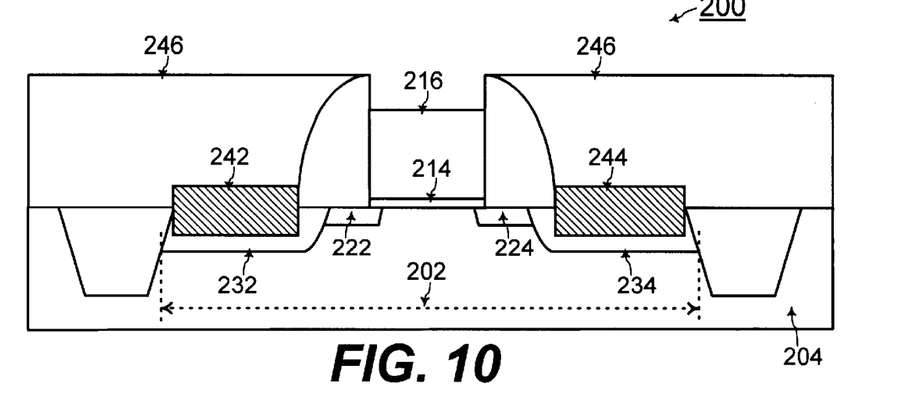

Referring to FIGS. 9 and 10, the hardmask dielectric material 218 is etched away from the top surface of the gate structure 216 to expose the top surface of the gate structure 216. When the hardmask dielectric material 218 is comprised of one of silicon nitride (SiN) or silicon oxynitride (SiON) and when the encapsulating dielectric material 246 is comprised of silicon dioxide ($SiO_2$), a selective etching agent such as phosphoric acid ($H_3PO_4$) selectively etches the hardmask dielectric material 218 while substantially preserving the encapsulating dielectric material 246. Thus, the encapsulating dielectric material 246 remains to cover the drain and source silicides 242 and 244 while the top surface of the gate structure 216 is exposed. Such selective etching processes are known to one of ordinary skill in the art of integrated circuit fabrication.

Figure 11:
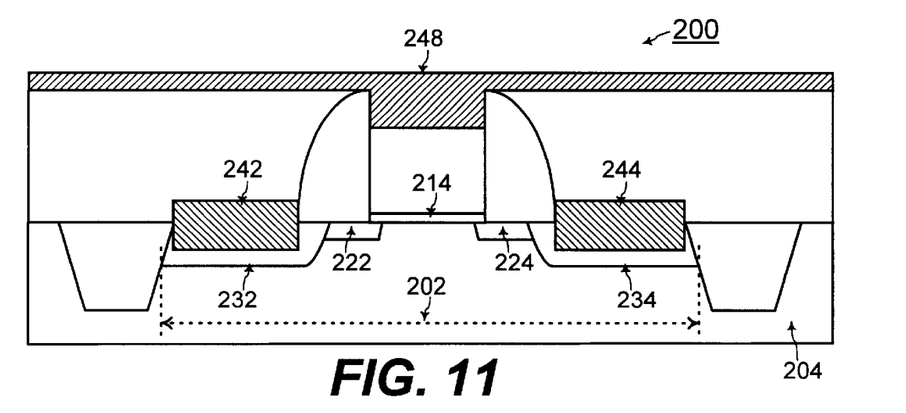

Referring to FIG. 11, a second layer of metal 248 is conformally deposited to contact the top surface of the gate structure 216. The encapsulating dielectric material 246 covers the drain and source silicides 242 and 244 to prevent contact of the second layer of metal 248 with the drain and source silicides 242 and 244. The second layer of metal 248 may be comprised of one of titanium, cobalt, nickel, or platinum, and processes for conformally depositing such metal are known to one of ordinary skill in the art of integrated circuit fabrication. However, the second layer of metal 248 is comprised of a different metal from that of the first layer of metal 236.

Figure 12:
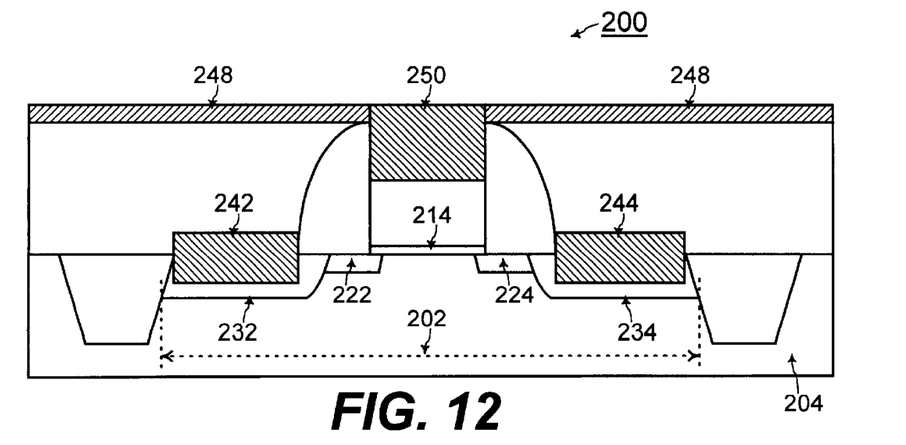

Referring to FIG. 12, a second silicidation process is performed to form a gate silicide 250 from a reaction of the second layer of metal 248 with the silicon of the gate structure 216. The gate silicide 250 is comprised of a second metal silicide material that depends on the metal of the second layer of metal 248. When the second layer of metal 248 is comprised of titanium, the gate silicide 250 is comprised of titanium silicide ($TiSi_2$). When the second layer of metal 248 is comprised of cobalt, the gate silicide 250 is comprised of cobalt silicide ($CoSi_2$). When the second layer of metal 248 is comprised of nickel, the gate silicide is comprised of nickel silicide ($NiSi_2$). When the second layer of metal 248 is comprised of platinum, the gate silicide 250 is comprised of platinum silicide ($PtSi_2$).

During the second silicidation process for forming the gate silicide 250, the encapsulating dielectric material 246 covers the drain and source silicides 242 and 244 to prevent contact of the second layer of metal 248 with the drain and source silicides 242 and 244. Thus, the drain and source silicides 242 and 244 are not further formed from a reaction of the second layer of metal 248 with the drain and source silicides 242 and 244 during the second silicidation process for forming the gate silicide 250.

Silicidation processes for formation of the gate silicide 250 such as by heating up the semiconductor substrate 204 are known to one of ordinary skill in the art of integrated circuit fabrication. The thickness of the gate silicide 250 depends on the thickness of the second layer of metal 248 and on the duration of heating up the semiconductor substrate 204 during the silicidation process. Such parameters are controlled such that the gate silicide 250 has a second thickness that is greater than the first thickness of the drain and source suicides 242 and 244 according to an advantageous aspect of the present invention. As the dimensions of the MOSFET 200 are scaled down such that the depth of the drain and source contact junctions 232 and 234 are scaled down, the first thickness of the drain and source silicides 242 and 244 are limited by the depth of the drain and source contact junctions 232 and 234. However, the second thickness of the gate silicide 250 is desired to be maximized to minimize parasitic resistance at the gate of the MOSFET 200.

In addition, according to another advantageous aspect of the present invention, the first silicide material comprising the drain and source suicides 242 and 244 is different from the second silicide material comprising the gate silicide 250. For example, nickel consumes less silicon during formation of nickel silicide ($NiSi_2$) than cobalt during formation of cobalt silicide ($CoSi_2$). For a relatively smaller first thickness of the drain and source suicides 242 and 244, the first layer of metal 236 is comprised of nickel for formation of nickel silicide ($NiSi_2$) for the drain and source silicides 242, whereas, for a relatively larger second thickness of the gate silicide 250, the second layer metal 248 is comprised of cobalt for formation of cobalt silicide ($CoSi_2$) for the gate silicide 250, according to one embodiment of the present invention.

Figure 13:
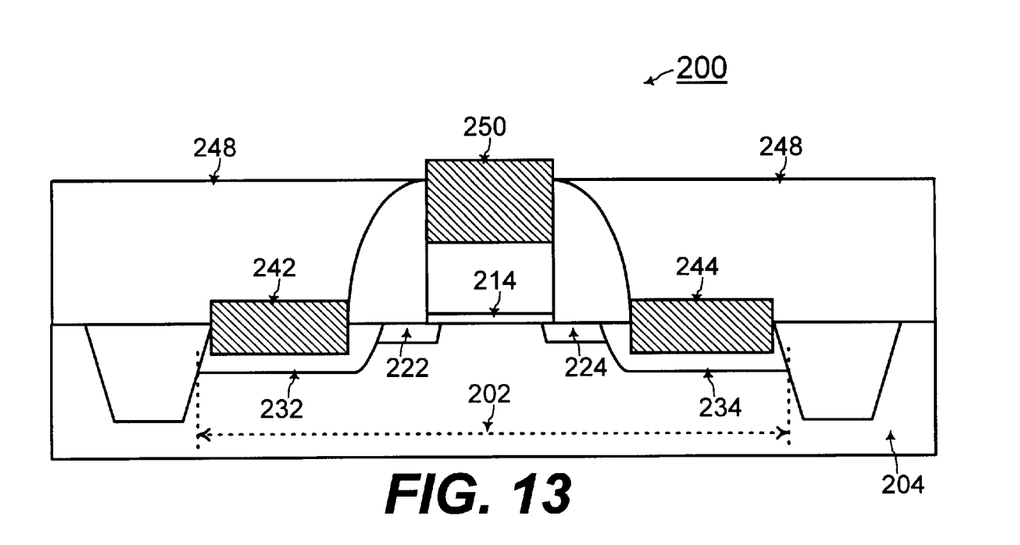

Referring to FIG. 13, any remaining portion of the second layer of metal 248 is removed after formation of the gate silicide 250. Processes for etching away the metal comprising the second layer of metal 248 are known to one of ordinary skill in the art of integrated circuit fabrication.

In this manner, with separate processes for formation of the drain and source silicides 242 and 244 and for formation of the gate silicide 250, the thickness of the gate silicide 250 is independent of the thickness of the drain and source silicides 242 and 244. Thus, unlike the drain and source silicides 242 and 244, the thickness of the gate silicide 250 is not limited by the decreased depth of the drain and source contact junctions 232 and 234 as the dimensions of the MOSFET 200 are further scaled down. A thicker gate silicide 250 and a different gate silicide material decrease parasitic resistance at the gate of the MOSFET 200 for enhanced speed performance of the MOSFET 200 such that the dimensions of the MOSFET 200 may be further scaled down. In addition, because the encapsulating dielectric material is deposited in a deposition process using a relatively low temperature of less than about 400° Celsius, short channel effects are minimized for the MOSFET having scaled down dimensions of tens of nanometers.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor having a gate structure on a gate dielectric within an active device area of a semiconductor substrate, the method including the steps of:

A. forming a drain extension junction and a source extension junction in said active device area of said semiconductor substrate;

B. forming spacers to cover said drain extension junction and said source extension junction and to cover sidewalls of said gate structure;

C. forming a drain contact junction adjacent said drain extension junction and forming a source contact junction adjacent said source extension junction by implanting a contact junction dopant into exposed regions of said active device area of said semiconductor substrate;

D. forming a hardmask dielectric material to cover a top surface of said gate structure;

E. forming a drain silicide with said drain contact junction that is exposed and forming a source silicide with said source contact junction that is exposed, wherein said drain silicide and said source silicide have a first thickness and are comprised of a first silicide material; and wherein said hardmask dielectric material that covers said top surface of said gate structure prevents formation of silicide with said gate structure during formation of said drain silicide and said source silicide;

F. depositing an encapsulating dielectric material, in a dielectric deposition process, to cover said drain silicide and said source silicide, and minimizing depth of said drain and source extension junctions by performing said dielectric deposition process at a temperature in a range of less than about 400° Celsius;

G. etching away said hardmask dielectric material from said top surface of said gate structure to expose said top surface of said gate structure; and H. forming a gate silicide with said gate structure, wherein said gate silicide has a second thickness and is comprised of a second silicide material;
   and wherein said encapsulating dielectric material covering said drain silicide and said source silicide prevents further formation of said drain silicide and said source silicide during formation of said gate silicide;
   and wherein said first silicide material of said drain silicide and said source silicide is different from said second silicide material of said gate silicide, and wherein said first thickness of said drain silicide and said source silicide is less than said second thickness of said gate silicide.

2. The method of claim 1, wherein said encapsulating dielectric material is comprised of silicon dioxide ($SiO_2$) conformally deposited on said drain silicide, said source silicide, and on said gate structure, and wherein the method further includes the step of:

polishing down said encapsulating dielectric material until said hardmask dielectric material on said gate structure is exposed with said encapsulating dielectric material remaining to cover said drain silicide and said source silicide.

3. The method of claim 2, wherein said hardmask dielectric material is comprised of one of silicon nitride (SiN) or silicon oxynitride (SiON), and wherein said exposed hardmask dielectric material is etched away from said top surface of said gate structure with phosphoric acid ($H_3PO_4$).

4. The method of claim 1, wherein said drain silicide and said source silicide are comprised of nickel silicide ($NiSi_2$), and wherein said gate silicide is comprised of cobalt silicide ($CoSi_2$).

5. A method for fabricating a MOSFET (metal oxide semiconductor field effect transistor) having a gate structure on a gate dielectric within an active device area of a semiconductor substrate, the method including the steps of:

A. forming a drain extension junction and a source extension junction in said active device area of said semiconductor substrate;

B. forming spacers to cover said drain extension junction and said source extension junction and to cover sidewalls of said gate structure;

C. forming a drain contact junction adjacent said drain extension junction and forming a source contact junction adjacent said source extension junction by implanting a contact junction dopant into exposed regions of said active device area of said semiconductor substrate;

D. forming a hardmask dielectric material comprised of one of silicon nitride (SiN) or silicon oxynitride (SiON) to cover a top surface of said gate structure;

E. forming a drain silicide with said drain contact junction that is exposed and forming a source silicide with said source contact junction that is exposed, wherein said drain silicide and said source silicide have a first thickness and are comprised of nickel silicide ($NiSi_2$), and wherein said hardmask dielectric material that covers said top surface of said gate structure prevents formation of silicide with said gate structure during formation of said drain silicide and said source silicide;

F. conformally depositing an encapsulating dielectric material comprised of silicon dioxide ($SiO_2$), on said drain silicide, said source silicide, and on said gate structure, in an oxide deposition process, and minimizing depth of said drain and source extension junctions by performing said oxide deposition process at a temperature in a range of less than about 400° Celsius;

G. polishing down said encapsulating dielectric material until said hardmask dielectric material on said gate structure is exposed with said encapsulating dielectric material remaining to cover said drain silicide and said source silicide.

H. etching away said hardmask dielectric material from said top surface of said gate structure with phosphoric acid ($H_3PO_4$) to expose said top surface of said gate structure; and I. forming a gate silicide of cobalt silicide ($CoSi_2$) with said gate structure, wherein said gate silicide has a second thickness;
   wherein said first thickness of said drain silicide and said source silicide is less than said second thickness of said gate silicide;
   and wherein said encapsulating dielectric material covering said drain silicide and said source silicide prevents further formation of said drain silicide and said source silicide during formation of said gate silicide.

* * * * *